(12) United States Patent
Washizu et al.

(10) Patent No.: US 7,913,002 B2
(45) Date of Patent: Mar. 22, 2011

(54) TEST APPARATUS, CONFIGURATION METHOD, AND DEVICE INTERFACE

(75) Inventors: Nobuei Washizu, Tokyo (JP); Atsunori Shibuya, Tokyo (JP)

(73) Assignee: Advantest Corporation, Tokyo (JP)

( * ) Notice: Subject to any disclaimer, the term of this patent is extended or adjusted under 35 U.S.C. 154(b) by 1025 days.

(21) Appl. No.: 10/923,634

(22) Filed: Aug. 20, 2004

(65) Prior Publication Data
US 2006/0041694 A1 Feb. 23, 2006

(51) Int. Cl.
*G06F 13/12* (2006.01)
(52) U.S. Cl. ............ 710/62; 324/765; 714/724; 714/742
(58) Field of Classification Search .................... 710/62; 714/724, 742; 324/765
See application file for complete search history.

(56) References Cited

U.S. PATENT DOCUMENTS

| | | | | |
|---|---|---|---|---|
| 4,806,852 A * | 2/1989 | Swan et al. | ................... | 324/73.1 |
| 5,426,361 A * | 6/1995 | Simmons | ................... | 324/158.1 |
| 5,794,175 A * | 8/1998 | Conner | ................... | 702/119 |
| 5,835,506 A * | 11/1998 | Kuglin | ................... | 714/738 |
| 5,925,145 A * | 7/1999 | Illes et al. | ................... | 714/738 |
| 6,028,439 A | 2/2000 | Arkin et al. | | |
| 6,064,213 A * | 5/2000 | Khandros et al. | ................... | 324/754 |
| 6,167,352 A * | 12/2000 | Kanevsky et al. | ................... | 702/81 |
| 6,202,186 B1 | 3/2001 | Oonk | | |
| 6,476,628 B1 * | 11/2002 | LeColst | ................... | 324/765 |
| 6,499,121 B1 * | 12/2002 | Roy et al. | ................... | 714/724 |
| 6,559,671 B2 * | 5/2003 | Miller et al. | ................... | 324/765 |
| 6,567,941 B1 * | 5/2003 | Turnquist et al. | ................... | 714/724 |
| 6,678,850 B2 * | 1/2004 | Roy et al. | ................... | 714/730 |
| 6,888,366 B2 * | 5/2005 | Kim et al. | ................... | 324/765 |
| 6,941,232 B2 * | 9/2005 | Burke et al. | ................... | 702/57 |
| 7,043,390 B2 * | 5/2006 | Jones et al. | ................... | 702/117 |

(Continued)

FOREIGN PATENT DOCUMENTS

WO 2004/090562 A1 10/2004

OTHER PUBLICATIONS

Extended European Search Report for European Application No. 05780263.5, mailed on Jul. 14, 2010 (7 pages).

*Primary Examiner* — Chun-Kuan Lee
*Assistant Examiner* — Ernest Unelus
(74) *Attorney, Agent, or Firm* — Osha Liang LLP (57) ABSTRACT

A test apparatus includes a bus switch unit capable of switching the output ports to select which of the output ports an input signal is output from, a control unit for inputting a plurality of control signals, according to a test program for testing the electronic device, to the bus switch unit and controlling which of the output ports each of the control signals is output from, a plurality of slots provided corresponding to the plurality of output ports, and a device interface capable of switching the connectors, which couple the plurality of slots and the electronic device, to select which of the connectors the slot is coupled to, wherein the device interface further includes a diagnosis decoder for sequentially supplying each of the test modules with a diagnosis signal via each of the connectors, and the control unit detects which of the test modules the diagnosis signal received via each of the connectors is supplied to and which of the connectors each of the output ports is coupled to based on a result of detecting the module.

9 Claims, 8 Drawing Sheets

U.S. PATENT DOCUMENTS

| | | |
|---|---|---|
| 7,047,174 B2 * | 5/2006 | Koh et al. ............... 703/14 |
| 7,076,714 B2 * | 7/2006 | Cook et al. ............. 714/742 |
| 7,356,435 B2 * | 4/2008 | Sato et al. .............. 702/118 |
| 7,765,443 B1 * | 7/2010 | Syed et al. ............. 714/724 |
| 2002/0199141 A1 * | 12/2002 | Lemlein et al. ........ 714/724 |
| 2003/0084413 A1 * | 5/2003 | Varney ...................... 716/4 |
| 2003/0105607 A1 * | 6/2003 | Jones et al. ............. 702/121 |
| 2003/0182601 A1 | 9/2003 | Richardson |
| 2004/0078740 A1 * | 4/2004 | Cook et al. ............. 714/718 |
| 2004/0153920 A1 * | 8/2004 | Holmes .................. 714/724 |
| 2004/0193990 A1 * | 9/2004 | Ichiyoshi ............... 714/742 |
| 2005/0010842 A1 * | 1/2005 | Burke et al. ............ 714/724 |
| 2005/0071715 A1 * | 3/2005 | Kolman .................. 714/724 |
| 2005/0166113 A1 * | 7/2005 | Ozawa .................... 714/736 |
| 2005/0182588 A1 * | 8/2005 | Chenoweth et al. ... 702/118 |
| 2005/0261856 A1 * | 11/2005 | Kushnick et al. ...... 702/117 |

* cited by examiner

| Slot | Board Name | Existence | Vendor ID | Module ID | Physical | Product No | Product S/N | Smx Port | PB1 | PB2 | Bus Port |
|---|---|---|---|---|---|---|---|---|---|---|---|
| 1 | SyncGen | 1 | AT | 5 | 2 | 000 | 000 | 3 | 62 | | 2 |
| 2 | | | | | | | | | | | |
| 3 | DM250M | 1 | AT | 4 | 4 | 000 | 000 | 1 | 80 | | 6 |
| 4 | DM250M | 1 | AT | 4 | 1 | 000 | 000 | 13 | 22 | | 3 |
| 5 | | | | | | | | | | | |
| 6 | LCDPS | 1 | AT | 6 | 2 | 000 | 000 | | 71 | 70 | 18 |
| 7 | | | | | | | | | | | |
| 8 | | | | | | | | | | | |
| ..... | | | | | | | | | | | |
| 64 | SyncGen | 1 | AT | 5 | 1 | 000 | 000 | 1 | 1 | | 1 |

TEST APPARATUS, CONFIGURATION METHOD, AND DEVICE INTERFACE

BACKGROUND OF THE INVENTION

1. Field of the Invention

The present invention relates to a test apparatus for testing an electronic device, a device interface used for the test apparatus, and a configuration method for the test apparatus.

2. Description of the Related Art

It has been known in the prior art that a test apparatus for testing electronic devices such as semiconductor circuits includes a device interface on which the electronic devices are mounted, test modules coupled to the electronic devices via the device interface and generating input signals to be input to the electronic devices, and a control unit for supplying signals to control the test modules. The test modules are mounted on slots provided between the device interface and the control unit.

In the above ordinary constitution, the coupling of a connector coupled to one of the electronic devices on the device interface and each of the slots is fixed, and a user cannot freely set it. Accordingly, it might be impossible to correspond to the purpose of the user, and that is inadequate from the point of view of scalability.

Contrary to the above constitution, to improve scalability, a constitution in which the coupling of each slot and a connector of the device interface can be freely set is taken into consideration. In this constitution, it is required to diagnose whether or not the slot and the connector are coupled according to the setting of a user. In the conventional test apparatus, since the above constitution is not considered, the function to diagnose the coupling relationship between the slot and the connector cannot be realized.

SUMMARY OF THE INVENTION

Therefore, it is an object of the present invention to provide a test apparatus, a configuration method, and a device interface, which is capable of overcoming the above drawbacks accompanying the conventional art. The above and other objects can be achieved by combinations described in the independent claims. The dependent claims define further advantageous and exemplary combinations of the present invention.

According to a first aspect of the present invention, a test apparatus for testing an electronic device includes a bus switch unit including a plurality of output ports, the bus switch unit capable of switching the output ports to select which of the output ports an input signal is output from, a control unit for inputting a plurality of control signals, according to a test program for testing the electronic device, to the bus switch unit and controlling which of the output ports each of the control signals is output from, a plurality of slots provided corresponding to the plurality of output ports, wherein a test module, which generates an input signal to be input to the electronic device based on the control signal and receives an output signal output by the electronic device, is mounted on one of the plurality of slots, and a device interface including a plurality of connectors to be coupled to the electronic device, the device interface capable of switching the connectors to select which of the connectors the slot is coupled to, wherein the device interface further includes a diagnosis decoder for sequentially supplying each of the test modules with a diagnosis signal, which is received from one of the slots mounted with one of the test modules for diagnosis, via each of the connectors, and the control unit detects which of the test modules the diagnosis signal received via each of the connectors is supplied to and which of the connectors each of the output ports is coupled to based on a result of detecting the module.

The test apparatus may further include a configuration memory for storing in advance a configuration file indicating which of the connectors each of the output ports is to be coupled to, wherein the control unit may judge whether or not the plurality of output ports and the plurality of connectors are properly coupled each other by comparing a result of detecting which of the connectors each of the output ports is coupled to with the configuration file.

The test apparatus may further include a plurality of the test modules, each of which is provided in each of the slots and includes a diagnosis circuit for outputting a predetermined signal to the control unit when receiving the diagnosis signal.

The diagnosis circuit may output the predetermined signal to the control unit via the output port corresponding to the slot, and the control unit may detect which of the connectors each of the output ports is coupled to, based on which of the output ports the predetermined signal is received from.

The configuration memory may store the configuration file further indicating first module identification information to identify the test module to be mounted on one of the slots, the test module may further include an identification memory for storing second module identification information about the test module, the diagnosis circuit may further output the second module identification information stored in the identification memory to the control unit, when receiving the diagnosis signal, and the control unit may further judge whether or not the test module is properly mounted on the slot by comparing the second module identification information received from the test module mounted on the slot with the first module identification information about the test module to be mounted on the slot stored in the identification memory.

The test module may further include a device test circuit for generating the input signal based on the control signal, and each of the connectors may include a device pin for coupling the device test circuit and the electronic device and a diagnosis pin for coupling the diagnosis circuit and the diagnosis decoder.

According to a second aspect of the present invention, a configuration method for configuring a test apparatus for testing an electronic device is provided, wherein the test apparatus includes a bus switch unit including a plurality of output ports, the bus switch unit capable of switching the output ports to select which of the output ports an input signal is output from, a control unit for inputting a plurality of control signals, according to a test program for testing the electronic device, to the bus switch unit and controlling which of the output ports each of the control signals is output from, a plurality of slots provided corresponding to the plurality of output ports, wherein a test module, which generates an input signal to be input to the electronic device based on the control signal and receives an output signal output by the electronic device, is mounted on one of the plurality of slots, and a device interface including a plurality of connectors to be coupled to the electronic device, the device interface capable of switching the connectors to select which of the connectors the slot is coupled to, and the configuration method includes a diagnosis signal supply step of sequentially supplying a diagnosis signal to each of the test modules via each of the connectors, a signal detection step of detecting which of the test modules the diagnosis signal is supplied to via each of the connectors, and a location detection step of detecting which of the connectors each of the output ports is coupled to based on a detection result in the signal detection step.

In the diagnosis signal supply step, a first one of the test modules for diagnosis mounted on one of the slots may sequentially generate the diagnosis signal to be supplied to a second one of the test modules.

According to a third aspect of the present invention, a device interface for coupling an electronic device and a test apparatus body for testing the electronic device is provided, wherein the test apparatus body includes a bus switch unit including a plurality of output ports, the bus switch unit capable of switching the output ports to select which of the output ports an input signal is output from, a control unit for inputting a plurality of control signals, according to a test program for testing the electronic device, to the bus switch unit and controlling which of the output ports each of the control signals is output from, and a plurality of slots provided corresponding to the plurality of output ports, wherein a test module, which generates an input signal to be input to the electronic device based on the control signal and receives an output signal output by the electronic device is mounted on one of the plurality of slots, and the device interface includes a plurality of connectors to be coupled to the electronic device, a switch circuit for switching the connectors to select which of the connectors the slot is coupled to, and a diagnosis decoder for sequentially supplying each of the test modules with a diagnosis signal, which is received from one of the slots mounted with one of the test modules for diagnosis, via each of the connectors.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
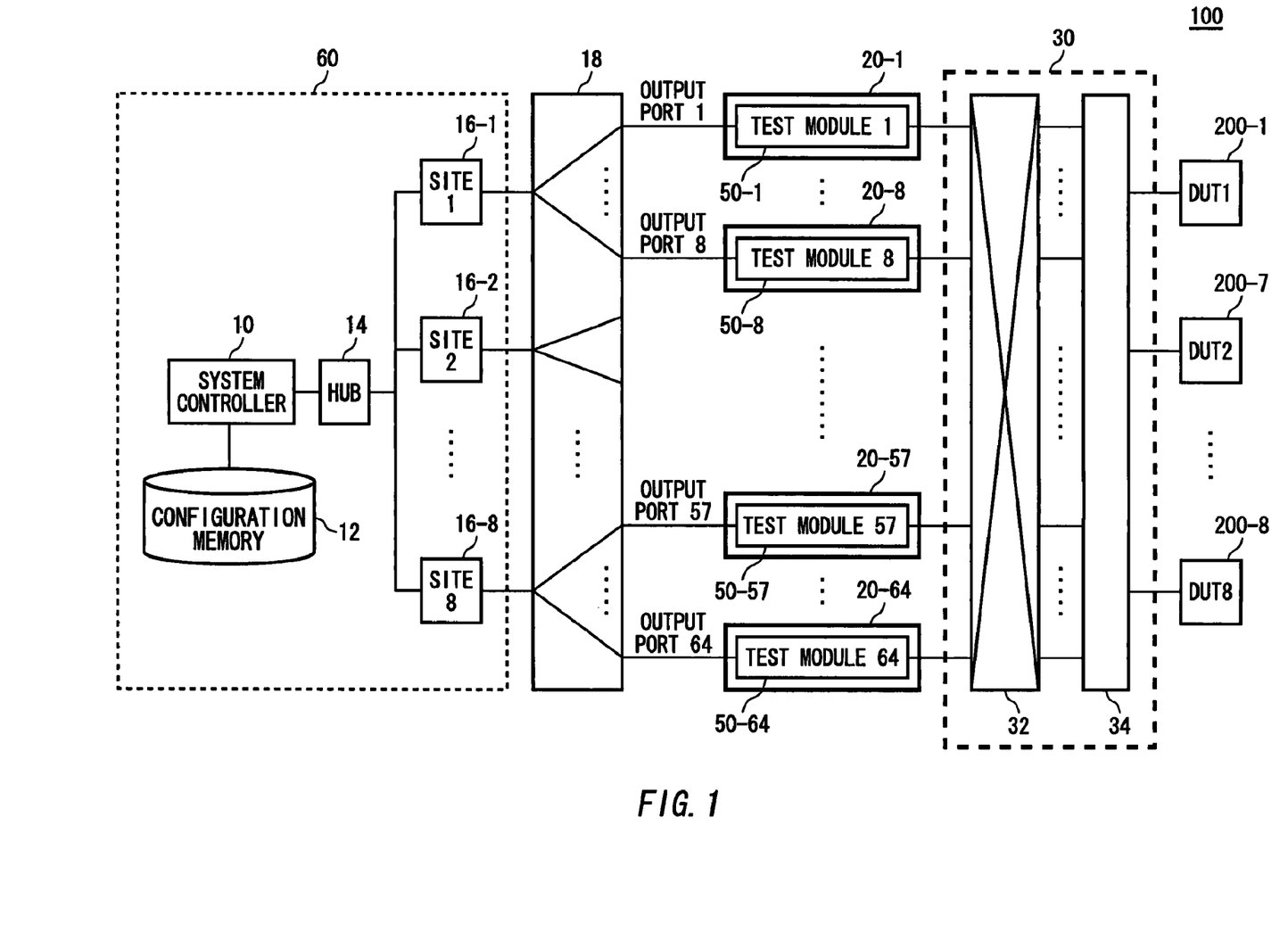
FIG. 1 shows an example of a constitution of a test apparatus 100 according to an exemplary embodiment of the present invention.

FIG. 1 shows an example of a constitution of a test apparatus 100 according to an exemplary embodiment of the present invention. The test apparatus 100 is an apparatus for testing a plurality of electronic devices (200-1 to 200-8, hereafter, generally referred to as 200) such as semiconductor chips, including a control unit 60, a bus switch unit 18, a plurality of slots (20-1 to 20-64, hereafter, generally referred to as 20), a plurality of test modules (50-1 to 50-64, hereafter, generally referred to as 50), and a device interface 30.

The control unit 60 inputs a plurality of control signals to the bus switch unit 18 according to a predetermined test program for the test of electronic devices 200. The control unit 60 includes a system controller 10, a configuration memory 12, a hub 14, and a plurality of sites (16-1 to 16-8, hereafter, generally referred to as 16).

The system controller 10 controls the operation of the test apparatus 100 according to the test program. That is, it generates control signals according to the test program. The plurality of sites 16 are provided corresponding to a plurality of electronic devices 200 under test and controls the test modules 50 coupled to the corresponding electronic devices 200, sending and receiving signals to and from the test modules 50. The hub 14 distributes the control signals generated by the system controller 10 to each of the sites 16. Moreover, the configuration memory 12 stores in advance a configuration file indicating the settings of the test apparatus 100. Here, the configuration file may be a file stored in advance by a user of the test apparatus 100, and the settings of the test apparatus 100 are, for example, the setting of the bus switch unit 18, the information about the test modules 50 being used, the setting of the device interface 30, the information indicating which of the connectors of the device interface 30 an output port of the bus switch unit 18 should be coupled to, the module identification information for identifying the test modules 50 to be respectively mounted on each slot 20, etc.

The bus switch unit 18 includes a plurality of output ports, switching the output ports to output input signals. That is, the bus switch unit 18 determines which of the output ports is allotted to each of the sites 16. As an example of the bus switch unit 18 in the present embodiment, the output ports 1 to 8 are allotted to the site 16-1, the output ports 9 to 16 are allotted to the site 16-2, and in the same way, eight ports are allotted to each of the sites 16. The control unit 60 controls either of the output ports is to output each of the control signals by controlling the bus switch unit 18.

The plurality of slots 20 on which the test modules 50 are mounted is provided corresponding to the plurality of output ports of the bus switch unit 18. Each of the test modules 50 sends and receives signals to and from the corresponding electronic device 200 for each of functions for the test of the electronic devices 200. For example, the test module 50 may be a module for generating an input signal to be input to the corresponding electronic device 200 based on the control signal, receiving an output signal output by the corresponding electronic device 200, and judging the pass or fail of the electronic device 200, or a module for supplying source power to the electronic device 200. Moreover, the test module 50 may be a module for sending and receiving analog or digital signals to and from the electronic device 200, or a module for sending and receiving direct or alternating signals to and from the electronic device 200.

The device interface 30 is a board on which the electronic devices 200 are mounted, electrically coupling the electronic devices 200 and the test modules 50. The device interface 30 includes a performance board 34 provided with a plurality of connectors to be coupled to the plurality of electronic devices 200 and a switch circuit 32 for switching the connectors to be coupled to the plurality of slots 20. The performance board 34 is also called a load board.

According to the test apparatus 100 of the present embodiment, by switching the bus switch unit 18, it is possible to arbitrarily couple the input and output ports of the bus switch unit 18 and the slots 20. Moreover, by switching the switch circuit 32, it is possible to arbitrarily couple the output ports of the bus switch unit 18 and the slots 20 and the connectors of the device interface 30. The switch circuit 32 may include a plurality of cables, changing the wirings of the cables to change the coupling of the slots 20 and the connectors. Further, the switch circuit 32 is also called a test fixture.

Figure 2:
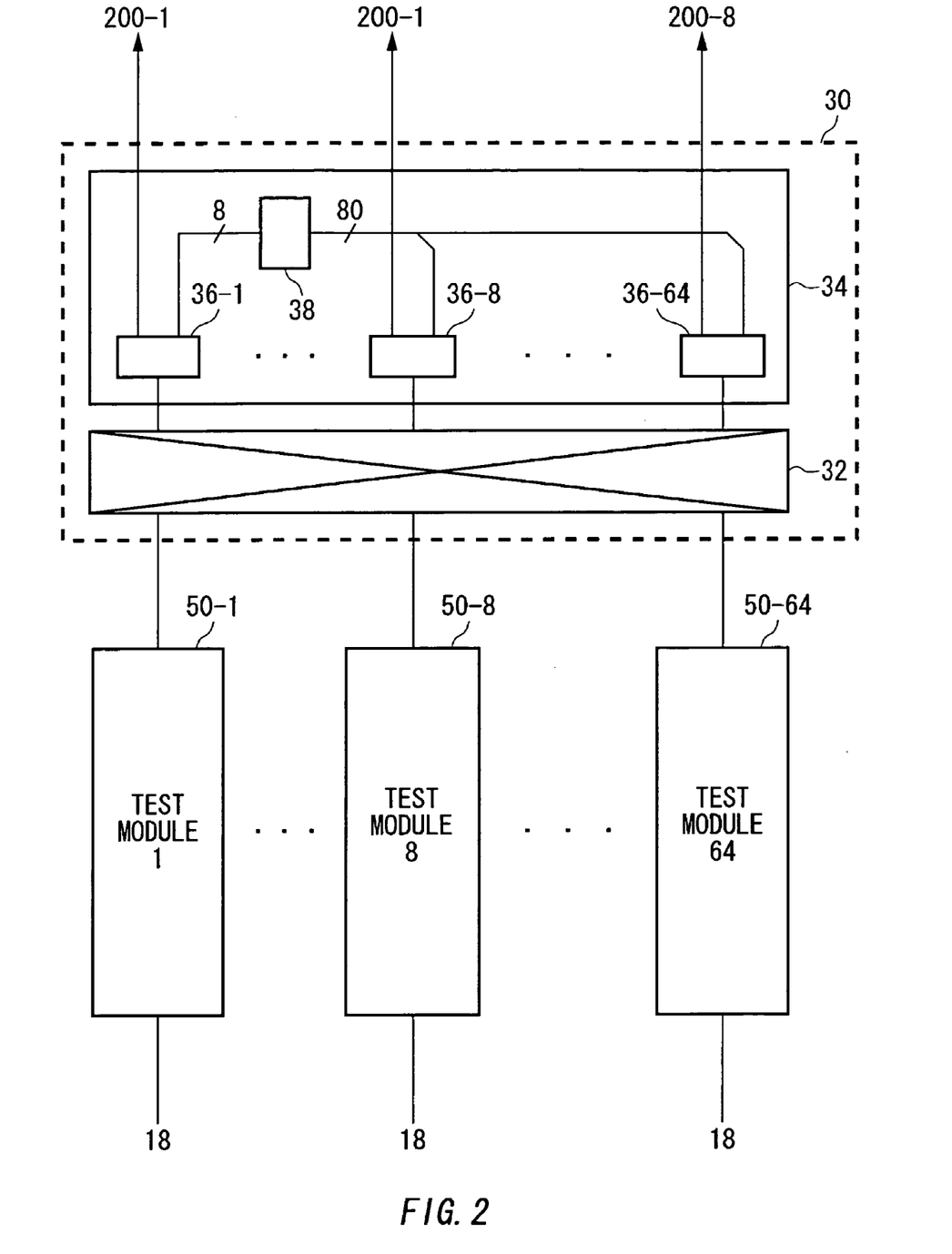
FIG. 2 shows an example of a constitution of a performance board 34.

FIG. 2 shows an example of a constitution of the performance board 34. The performance board 34 includes a plurality of connectors (36-1 to 36-64, hereafter, generally referred to as 36) and a diagnosis decoder 38.

The plurality of connectors 36 is coupled to the test modules 50 via the switch circuit 32, electrically couples the test modules 50 and the electronic devices 200. As described above, by setting the switch circuit 32, it is possible to couple one of the test modules 50 and one of the connectors 36.

The test apparatus 100 of the present embodiment has a test mode to test the electronic devices 200 and a diagnosis mode to check the coupling relationship between the output ports of the bus switch unit 18 and the connectors 36.

In operating as the test mode, each of the test modules 50 sends and receives signals to and from the electronic devices 200 via the corresponding connector 36. In operating as the diagnosis mode, the test apparatus 100 mounts the test module 50 for diagnosis onto a predetermined slot 20, and the test module 50 for diagnosis transmits a diagnosis signal from each of the connectors 36 in the order of the switch circuit 32, another test module 50, and the output port of the bus switch unit 18. The control unit 60 detects which of other test modules 50 the diagnosis signal supplied to each of the connectors 36 is transmitted to, and checks whether or not the setting of the switch circuit 32 is matched with the configuration file stored in the configuration memory 12. That is, the control unit 60 judges whether or not the plurality of output ports and the plurality of connectors 36 are properly coupled by comparing the result of detecting which of the connectors 36 each of the output ports is coupled to with the configuration file. If the plurality of output ports and the plurality of connectors 36 are not properly coupled, the control unit 60 informs the user of the test apparatus 100 of the status.

The diagnosis decoder 38 sequentially supplies the diagnosis signal received from the slot 20 mounted with the test module 50 for diagnosis to each of the test modules 50 via each of the connectors 36. The slot 20, on which the test module 50 for diagnosis is mounted, is determined in advance, and in the present embodiment the test module 50 for diagnosis is mounted on the slot 20-1.

Moreover, the diagnosis decoder 38 sequentially supplies each of the test modules 50 with the diagnosis signal received from the slot 20-1 via a predetermined connector 36-1 among the plurality of connectors 36. Here, if the test apparatus 100 operates as the diagnosis mode, the control unit 60 controls the switch circuit 32 so that the slot 20-1 on which the test module 50-1 for diagnosis is to be mounted is coupled to the predetermined connector 36-1 among the plurality of connector 36, and supplies the test module 50-1 for diagnosis with the control signal to generate the diagnosis signal.

The test module 50-1 for diagnosis generates the diagnosis signal to designate each of the connectors 36 according to the given control signal. For example, the test module 50-1 for diagnosis generates a diagnosis signal of a plurality of bits to designate each of the connectors 36 as a binary number. The diagnosis decoder 38 decodes the diagnosis signal of a binary number into the diagnosis signal of a plurality of bits where only the bits represented by the binary number become 1. Each bit of the diagnosis signal output by the diagnosis decoder 38 corresponds to one of the plurality of connectors 36, and is supplied to the test module 50 via the corresponding connector 36. For example, the test module 50-1 for diagnosis can sequentially supply the diagnosis signal indicating a predetermined logic value to each of the test modules 50 by sequentially generating the diagnosis signal of a binary number increasing by 1. Hereafter, the diagnosis signal of H logic will be described for example.

Figure 3:
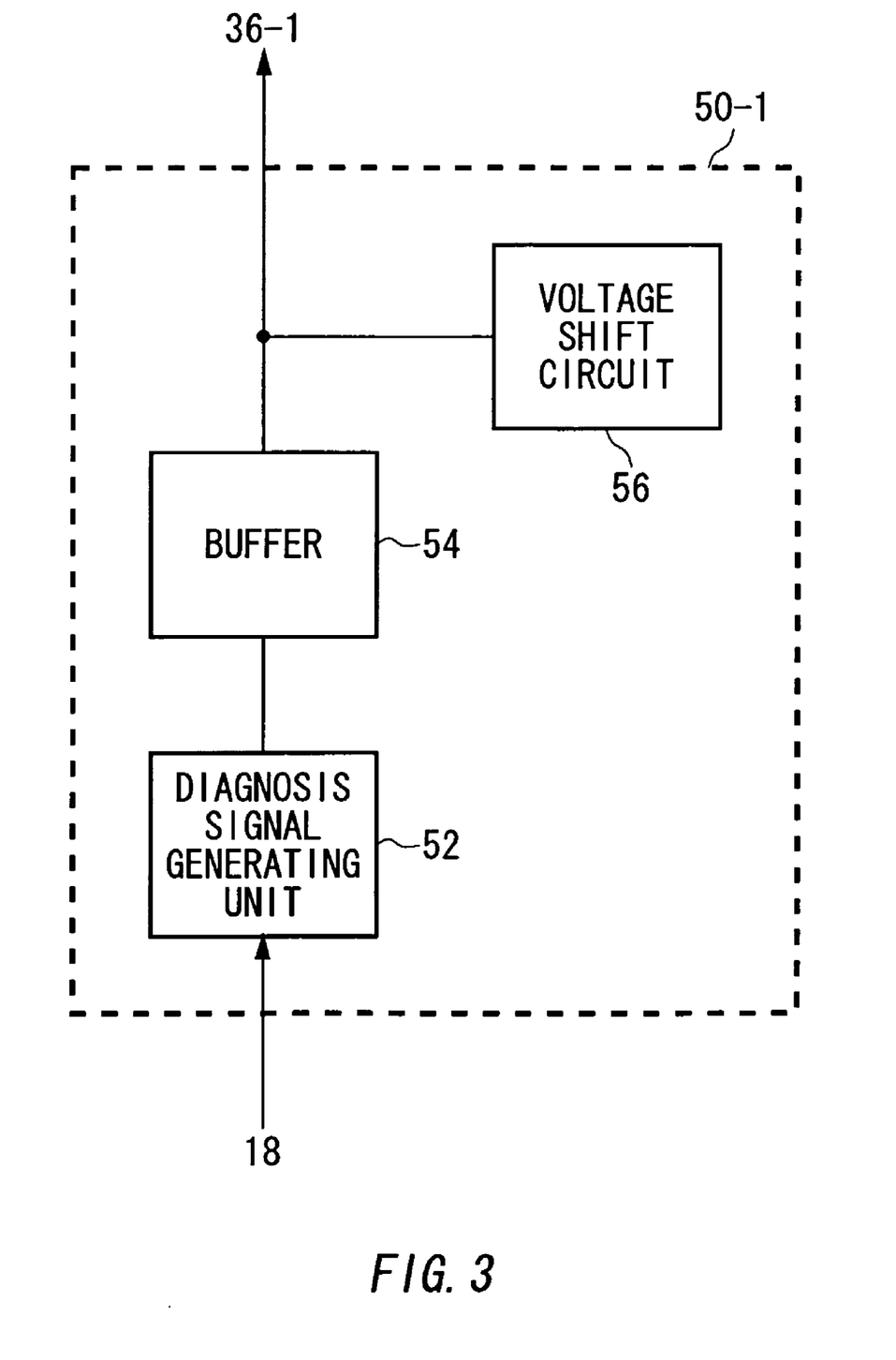
FIG. 3 shows an example of a constitution of a test module 50-1 for diagnosis.

FIG. 3 shows an example of a constitution of the test module 50-1 for diagnosis. The test module 50-1 for diagnosis includes a diagnosis signal generating unit 52, a buffer 54, and a voltage shift circuit 56.

The diagnosis signal generating unit 52, as described above, generates the diagnosis signal according to the control signal given by the control unit 60 via the bus switch unit 18. For example, the control unit 60 sequentially supplies the diagnosis signal generating unit 52 with a plurality of control signals to sequentially designate each of the connectors 36, and the diagnosis signal generating unit 52 sequentially generates the diagnosis signal of a binary number corresponding to the connector 36 designated by each of the control signals. The buffer 54 is provided between the diagnosis signal generating unit 52 and the voltage shift circuit 56, supplying the diagnosis signal generated by the diagnosis signal generating unit 52 to the diagnosis decoder 38 via the connector 36-1. Moreover, the voltage shift circuit 56 adjusts the voltage level of the diagnosis signal output by the buffer 54 to a predetermined level.

Figure 4:
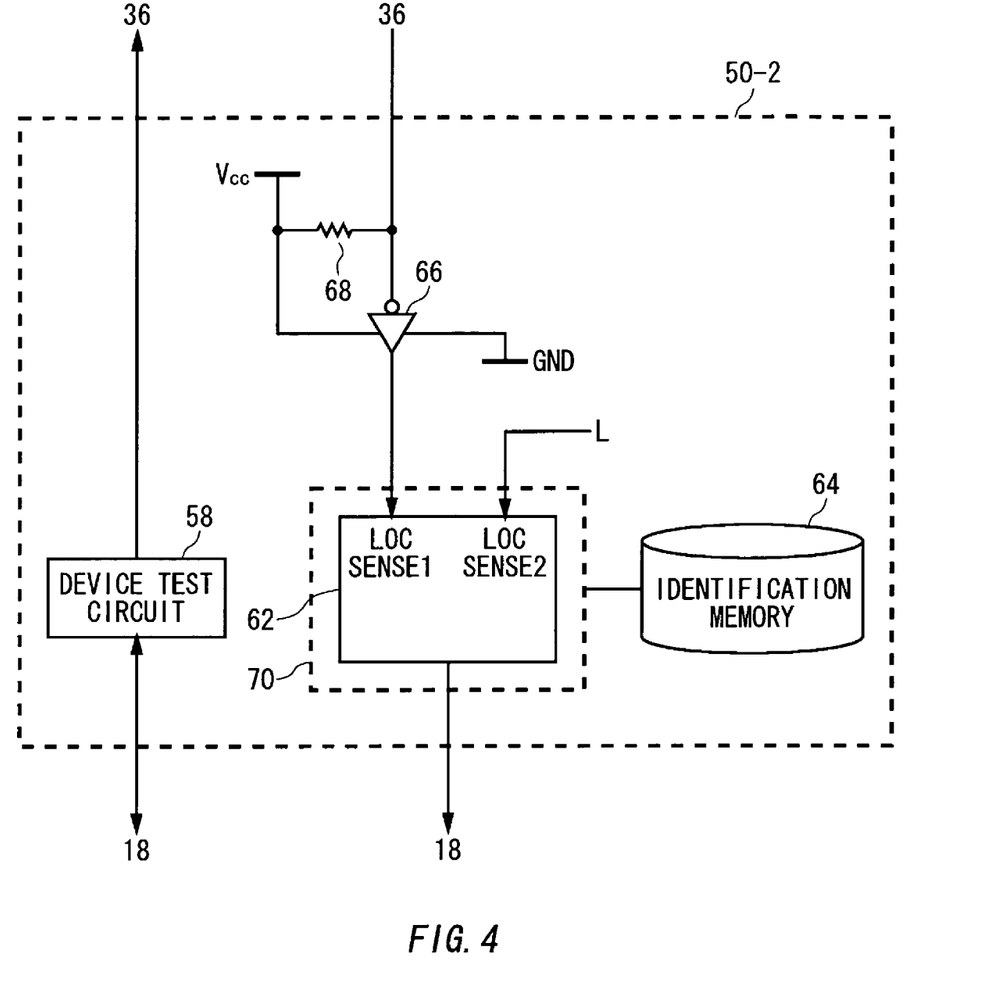
FIG. 4 shows an example of a constitution of other test module 50.

FIG. 4 shows an example of a constitution of another test module 50. Here, the test module 50 is a test module 50 mounted on one of the slots 20 except the slot 20 on which the test module 50-1 for diagnosis is mounted.

The test module 50 includes a device test circuit 58 for testing the electronic device 200 and a diagnosis circuit 70 for outputting a predetermined signal to the control unit 60 when receiving the diagnosis signal indicating H logic.

The device test circuit 58 is controlled by the control signal received from the control unit 60 when the test apparatus 100 is operating as the test mode. Moreover, the device test circuit 58 informs the control unit 60 of the result of testing the electronic device 200 via the bus switch unit 18.

The diagnosis circuit 70 outputs a predetermined signal to the control unit 60 when receiving the diagnosis signal indicating H logic. The diagnosis circuit 70 in the present embodiment outputs the predetermined signal to the control unit 60 via the output and input ports of the bus switch unit 18 corresponding to the slot 20 mounted with the concerned test module 50. Here, the predetermined signal may be the diagnosis signal. Moreover, the diagnosis circuit 70 may output the information about the test module 50 to the control unit 60 together.

The control unit 60 can determine the output port of the bus switch unit 18 being coupled to the connector 36 designated by the control signal by detecting which of the output ports of the bus switch unit 18 the signal output by the diagnosis circuit 70 is received through. Moreover, the control unit 60 can judge whether the coupling of the input and output ports of the bus switch unit 18, the slot 20, and the connector 36 is matched with the configuration file by detecting which of the input ports of the bus switch unit 18 the signal output by the diagnosis circuit 70 is received through.

The diagnosis circuit 70 includes a pull-up resistor 68, a buffer 66, a location sense circuit 62, and an identification memory 64. The buffer 66 inputs the diagnosis signal to the location sense circuit 62. The location sense circuit 62 includes an input terminal (Loc_SENSE1) to which the diagnosis signal is input, outputting a predetermined signal to the control unit 60 when H logic is input to the input terminal.

The identification memory 64 stores the module identification information, the manufacturer identification information, the product type number, the product serial number, etc. about the test module 50. The diagnosis circuit 70 outputs the information about the test module 50 to the control unit 60 when receiving the diagnosis signal of H logic. In this case, the control unit 60 can further judge whether or not the test module 50 is properly mounted on each of the slots 20 by comparing the module identification information received from the test module 50 mounted on each of the slots 20 with the module identification information in the configuration file about the test module 50 which should be mounted on the slot 20.

Moreover, the location sense circuit 62 includes a plurality of input terminals coupled to a plurality of connectors 36 when the test module 50 is coupled to a plurality of connectors 36. In this case, it is desirable that the location sense circuit 62 outputs a predetermined signal for each signal input to each of the input terminals. For example, if the location sense circuit 62 includes two input terminals (Loc_SENSE1 and Loc_SENSE2), it is desirable that the location sense circuit 62 informs the control unit 60 of both the information indicating whether or not the logic value of the signal input to the input terminal (Loc_SENSE1) is H and the information indicating whether or not the logic value of the signal input to the input terminal (Loc_SENSE2) is H. Moreover, if the location sense circuit 62 includes a plurality of input terminals and is coupled to one connector 36, the input terminals except ones of the location sense circuit 62 coupled to the connector 36 are given a signal of L logic.

Figure 5:
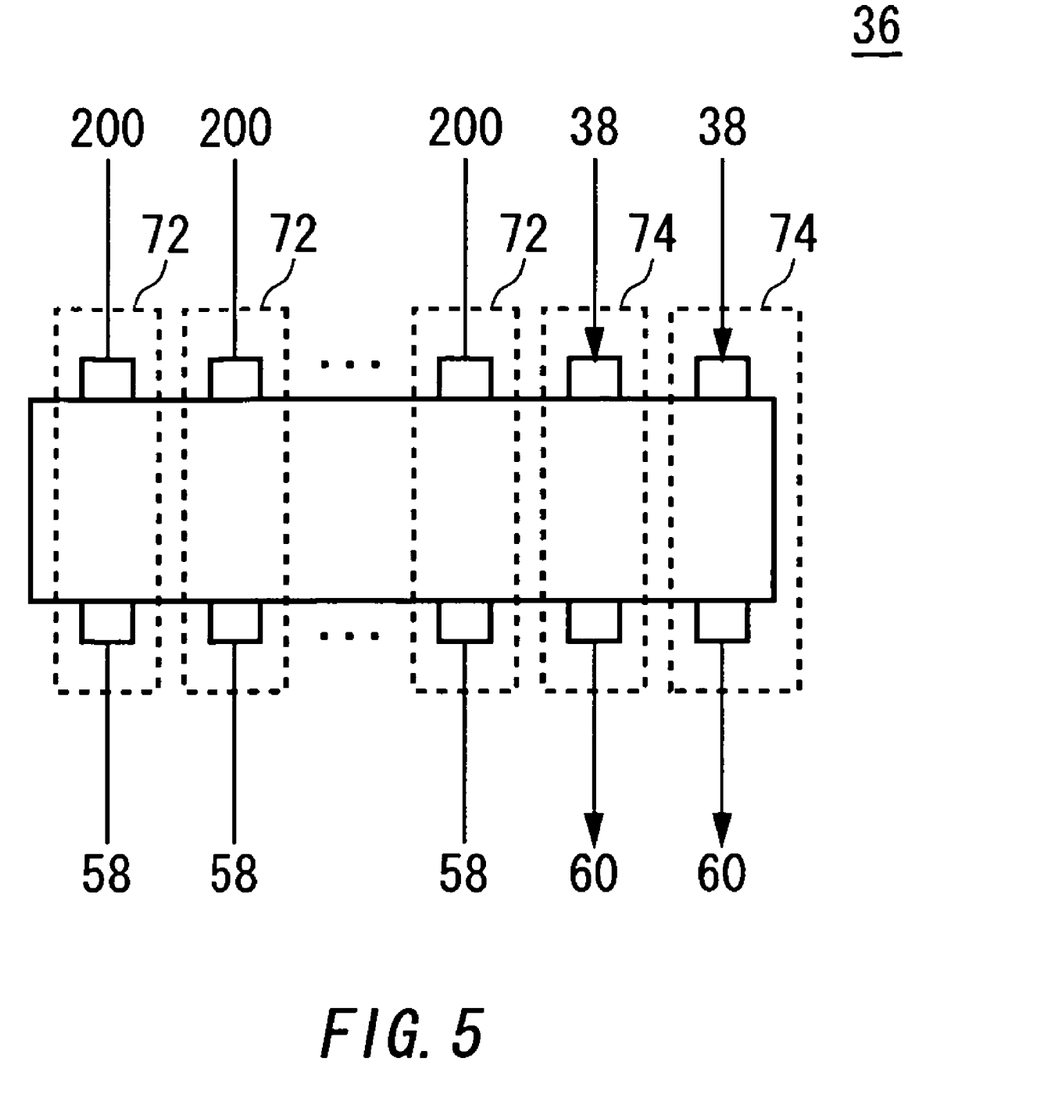
FIG. 5 shows an example of a constitution of a connector 36.

FIG. 5 shows an example of a constitution of the connector 36. The connector 36 includes device pins 72 for coupling the device test circuit 58 and the electronic device 200 and diagnosis pins 74 for coupling the diagnosis circuit 70 and the diagnosis decoder 38. By this constitution, after setting the test apparatus 100 for the test of the electronic devices 200, it is possible to check whether or not the test apparatus 100 is properly set without changing the setting. For each of the connector 36, it is desirable that the device pins 72 and the diagnosis pins 74 are provided in a predetermined pin arrangement. Moreover, the connector 36 coupled to the test module 50-1 for diagnosis couples the diagnosis decoder 38 and the test module 50-1 for diagnosis with the diagnosis pins 74.

Figure 6:
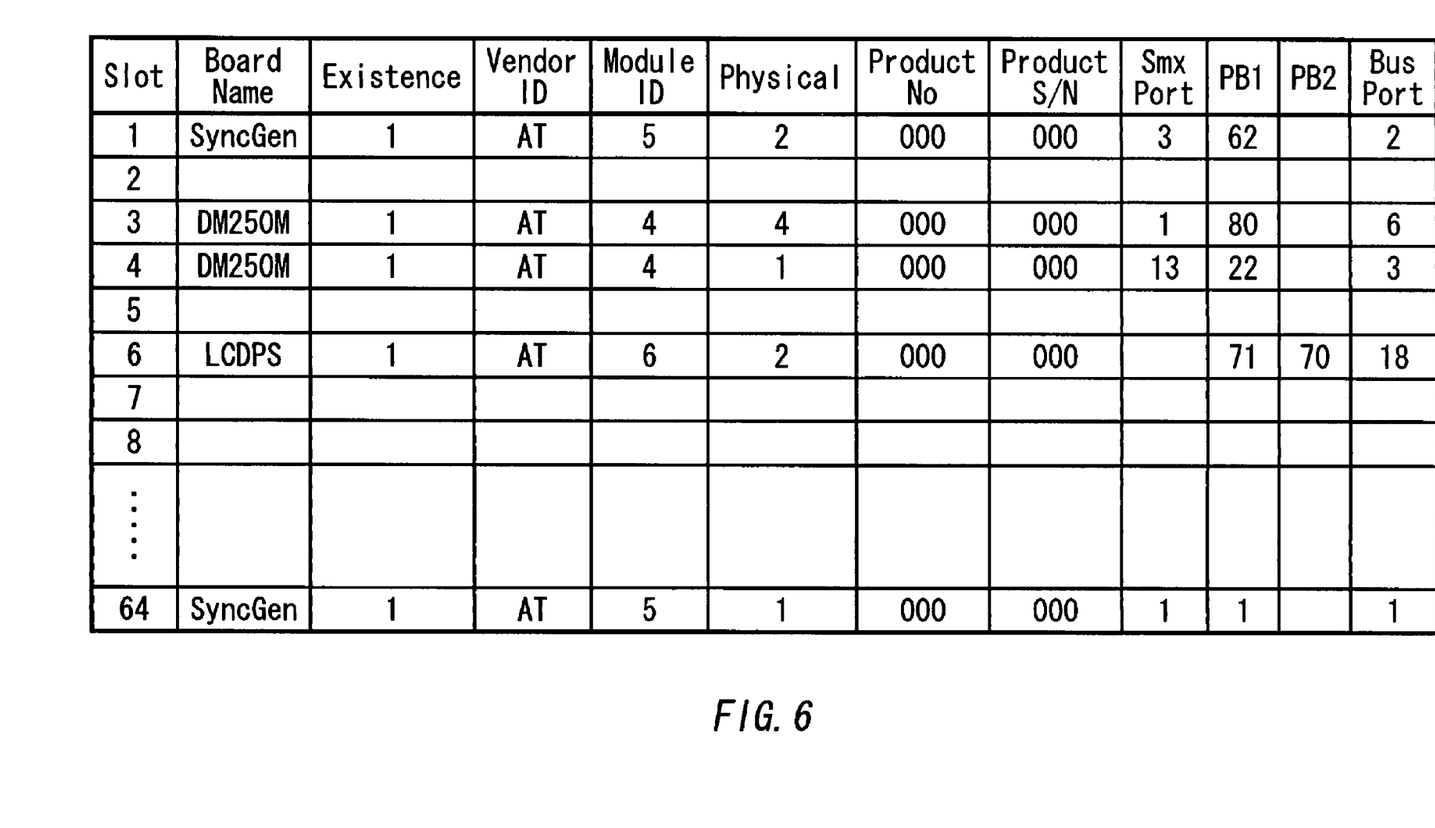
FIG. 6 shows an example of the data structure of a configuration file.

FIG. 6 shows an example of the data structure of the configuration file. As shown in FIG. 6, the configuration memory 12 stores in advance the configuration file, in which the identification number of the slot 20 (Slot), the name of the test module to be mounted on each of the slots 20 (Board Name), the existence information indicating whether or not the test module 50 is mounted on the each of the slot 20 (Existence), the manufacturer identification information about the test module 50 (Vendor ID), the identification information about the test module 50 (Module ID), the physical number indicating the physical location at which the test module 50 is to be mounted (Physical), the product type number of the test module 50 (Product ID), the product serial number of the test module 50 (Product S/N), the input port number of the bus switch unit 18 to be coupled to the test module 50, the identification number of the connector 36 to be coupled to the test module 50 (PB1 and PB2), and the output port number of the bus switch unit 18 to be coupled to the test module 50 (Bus Port) is contained in a corresponding manner.

Figure 7:
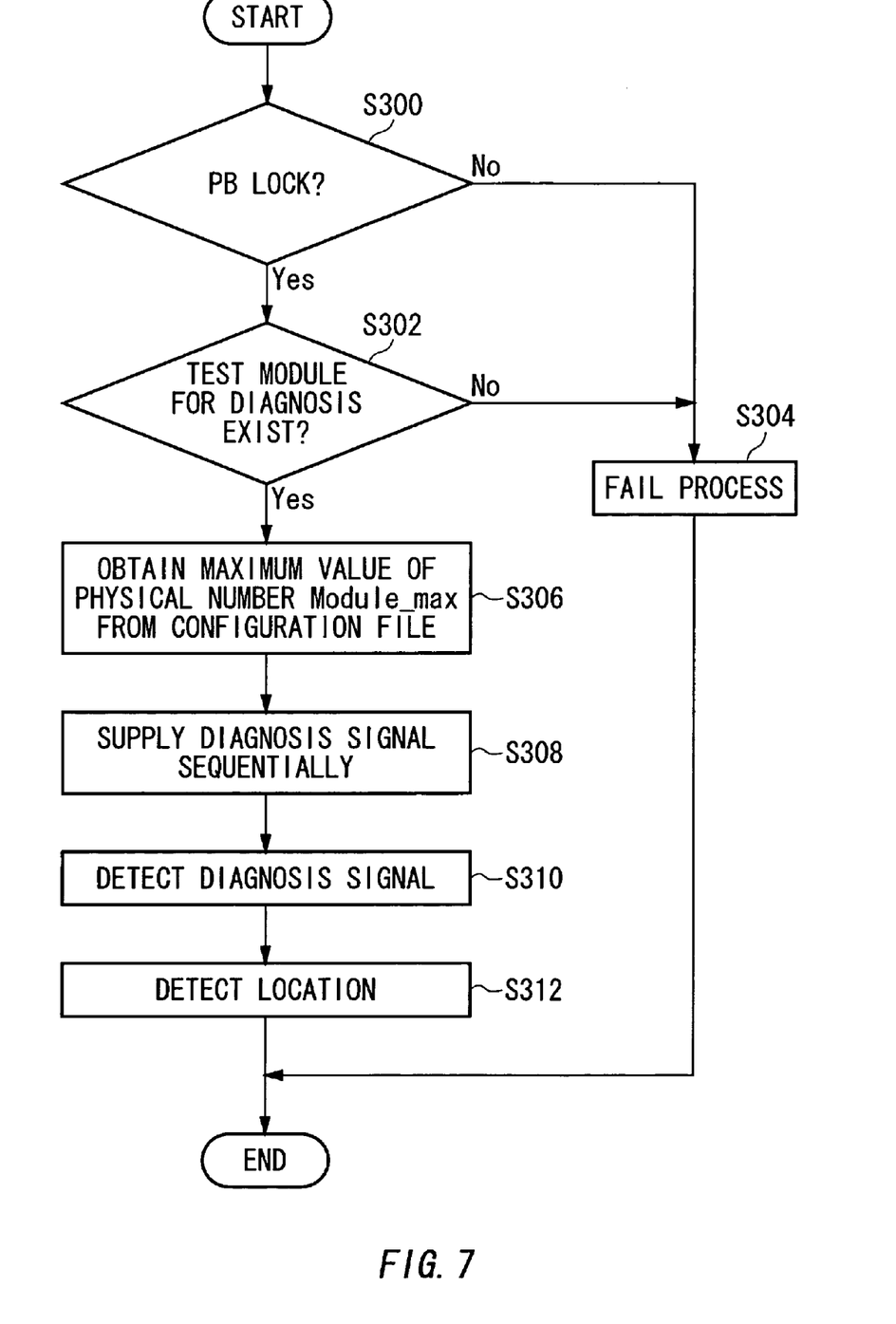
FIG. 7 is a flowchart showing an example of a configuration method for a test apparatus 100.

FIG. 7 is a flowchart showing an example of a configuration method for the test apparatus 100. First, the switch circuit 32 is set for the test of the electronic devices 200, and the setting is fixed. Then, it is judged whether the setting is fixed or not (S300). If the setting is not fixed, a Fail process is performed (S304), and the configuration process is finished. If the setting is fixed, it is judged whether or not the test module 50-1 for diagnosis is mounted on a predetermined slot 20 (S302).

If the test module 50-1 for diagnosis is not mounted on the predetermined slot 20, the Fail process is performed (S304), and the configuration is finished. If the test module 50-1 for diagnosis is mounted on the predetermined slot 20, the maximum value of the physical number (Module_max) set in the configuration file is obtained (S306).

Then, as the physical number is changed from 1 to Module_max, the diagnosis signal to be H logic is sequentially supplied to the connector 36 corresponding to each physical number, and the diagnosis signal is sequentially supplied to each of the test modules 50 (a diagnosis signal supply step S308).

Then, as described in connection with FIGS. 1 to 6, it is detected which of the test modules 50 the diagnosis signal is supplied to via each connector 36 (a signal detection step S310). Moreover, it is detected which of the connectors 36 each of the output ports is coupled to based on the detection result of the signal detection step S310 (a location detection step S312). The processes S310 and S312 may be performed again whenever the diagnosis signal is supplied to each of the connectors 36 in S308.

Figure 8:
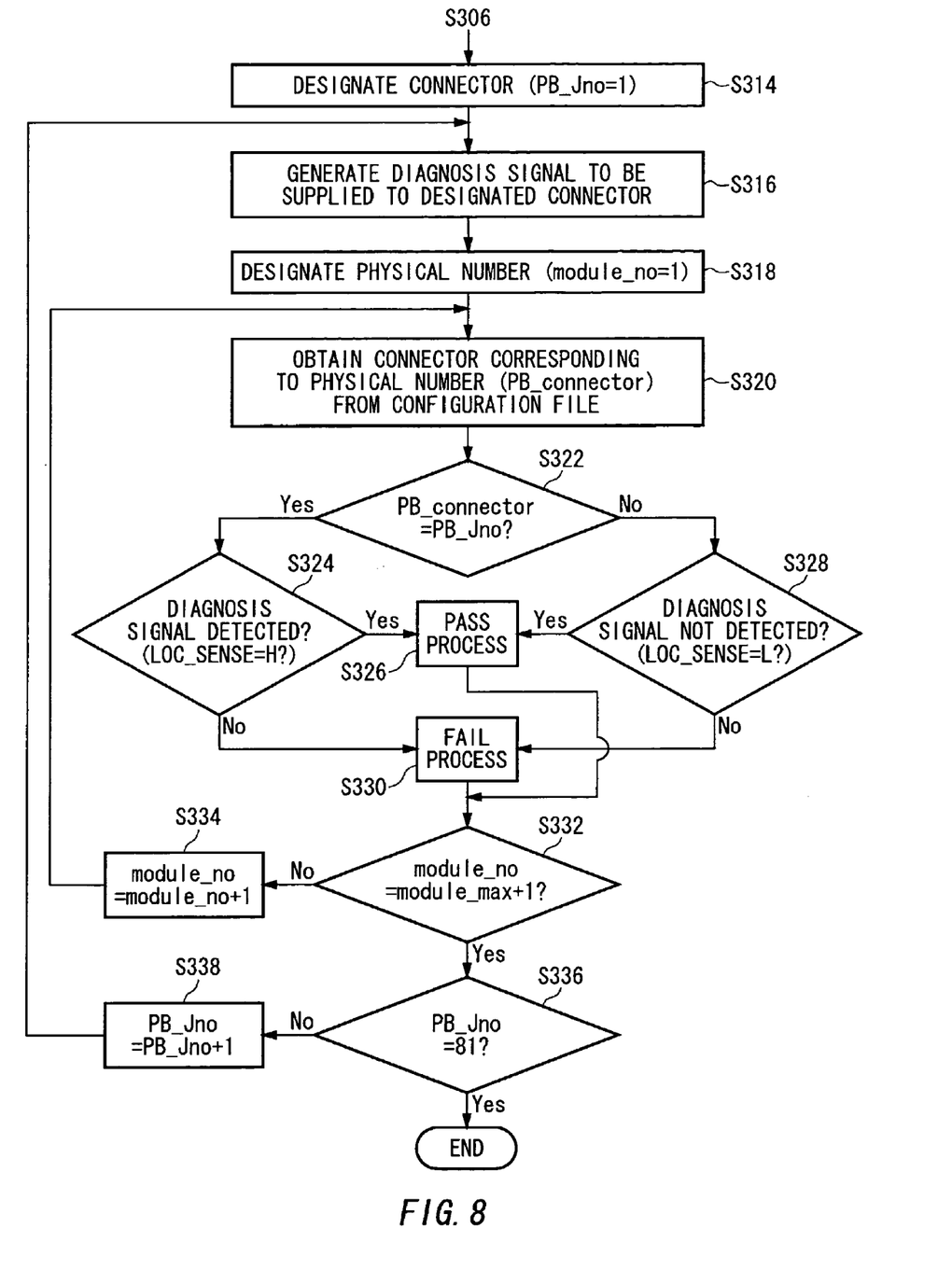
FIG. 8 is a flowchart showing detailed processes of S308, S310, and S312.

FIG. 8 is a flowchart showing the detailed processes of S308, S310, and S312. First, the connector 36 on which the coupling relationship is diagnosed is designated (S314). Here, the connector identification number 1 (PB_Jno=1) is designated.

Moreover, the test module 50-1 for diagnosis generates the diagnosis signal to be supplied to the connector 36 designated (S316). If the connector identification number 1 is designated, for example, the test module 50-1 generates the diagnosis signal indicating 1 in a binary number.

Then, the physical number is designated (S318). Here, the physical number 1 (module_no=1) is designated. Moreover, the identification number of the connector 36 (PB_connector=PB_1) corresponding to the physical number is obtained from the configuration file (S320). Here, if the test module 50 is coupled to a plurality of connectors 36, a plurality of connector identification numbers is obtained for the physical number in S320 (for example, PB_connector=PB_1 and PB_2).

Then, the connector identification number (PB_Jno) designated in S314 and the connector identification number (PB_connector) obtained in S320 are compared (S322). If PB_connector=PB_Jno, it is detected whether or not the diagnosis signal of H logic is supplied to the diagnosis circuit 70 of the test module 50 corresponding to the physical number (S324). Whether or not the diagnosis signal of H logic is supplied to the diagnosis circuit 70 of the test module 50 can be detected based on a signal output from the diagnosis circuit 70 to the output port of the bus switch unit 18 corresponding to the physical number. That is, based on the signal output to the output port, it is detected whether or not the diagnosis signal of H logic is input to the input terminal (Loc_SENSE) of the diagnosis circuit 70.

If the switch circuit 32 is properly set in the case of PB_connector=PB_Jno, the diagnosis signal of H logic is supplied to the test module 50 corresponding to the physical number, so a Pass process is performed (S326) if it has been detected that the diagnosis signal of H logic is supplied to the diagnosis circuit 70, or, if not, the Fail process is performed (S330).

Moreover, if PB_connector≠PB_Jno in S322, it is detected whether the diagnosis signal of H logic is not supplied to the diagnosis circuit 70 of the test module 50 corresponding to the physical number (S324). If the switch circuit 32 is properly set in the case of PB_connector≠PB_Jno, a signal of L logic is supplied to the test module 50 corresponding to the physical number, so the Fail process is performed (S330) if it has been detected that the diagnosis signal of H logic is supplied to the diagnosis circuit 70, or the Pass process is performed (S326) if it has been detected that the diagnosis signal of L logic is supplied.

Moreover, by judging whether or not the designated physical number is equal to the maximum value of the physical number obtained in S306 added with 1, it is judged whether or not the above processes have been performed for all of the physical numbers (S332), and if there are any remaining physical numbers, the designated physical number is added with 1 (S334) and the processes of S320 and S332 are performed again. If the processes have been performed for all of the physical numbers, it is judged whether or not the connector identification number designated is larger than the number of the connectors already known so as to judge whether or not the diagnosis has been performed for all of the connectors 36 (S336), and if there are any connectors 36 which have not been diagnosed yet, the connector identification number designated is added with 1 (S338), and the processes of S320 and S332 are performed again. If the diagnosis is completed for all of the connectors 36, the configuration process is finished.

By the above processes, for all of the connectors 36, it is possible to diagnose whether or not the connectors 36 are properly coupled to the output ports, slots 20, etc.

According to the present invention, it is possible to diagnose whether or not connectors coupled to electronic devices and slots on which test modules are mounted are properly coupled. Moreover, it is possible to diagnose whether or not the test modules are properly mounted on each of the slots.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing an electronic device, comprising:
a bus switch unit comprising a plurality of output ports, said bus switch unit switching said output ports to select which of said output ports an input signal is output from;
a control unit that inputs a plurality of control signals, according to a test program for testing said electronic device, to said bus switch unit and controls which of said output ports each of said control signals is output from;
a plurality of slots provided corresponding to said plurality of output ports, wherein a test module, which generates an input signal to be input to said electronic device based on said control signal and receives an output signal output by said electronic device, is mounted on one of said plurality of slots; and
a device interface comprising:
a plurality of connectors to be coupled to said electronic device, said device interface switching said connectors to select which of said connectors is coupled to said one of said plurality of slots; and
a diagnosis decoder that sequentially supplies a diagnosis signal from one of said connectors to said test module to the output port of said bus switch unit to which said one of said plurality of slots corresponds,
wherein said control unit obtains information representing from which of said connectors said test module receives said diagnosis signal supplied by said diagnosis decoder, and detects which of said connectors is coupled to each of said output ports by comparing a connector identification number corresponding to said information with a connector identification number stored in a configuration file indicating module identification information identifying said test module to be mounted on said one of said plurality of slots.

2. The test apparatus as claimed in claim 1 further comprising a configuration memory for storing in advance a configuration file indicating which of said connectors each of said output ports is to be coupled to, wherein said control unit judges whether or not said plurality of output ports and said plurality of connectors are properly coupled to each other by comparing a result of detecting which of said connectors each of said output ports is coupled to with said configuration file.

3. The test apparatus as claimed in claim 1 further comprising a plurality of said test modules, each of which is provided in one of said slots and comprises a diagnosis circuit for outputting a predetermined signal to said control unit when receiving said diagnosis signal.

4. The test apparatus as claimed in claim 3, wherein said diagnosis circuit outputs said predetermined signal to said control unit via said output port corresponding to said slot, and said control unit detects which of said connectors each of said output ports is coupled to, based on which of said output ports said predetermined signal is received from.

5. A test apparatus for testing an electronic device, comprising:
a bus switch unit comprising a plurality of output ports, said bus switch unit switching said output ports to select which of said output ports an input signal is output from;
a control unit that inputs a plurality of control signals, according to a test program for testing said electronic device, to said bus switch unit and controls which of said output ports each of said control signals is output from;
a plurality of slots provided corresponding to said plurality of output ports, wherein a test module, which generates an input signal to be input to said electronic device based on said control signal and receives an output signal output by said electronic device, is mounted on each of said plurality of slots;
a device interface comprising:
a plurality of connectors to be coupled to said electronic device, said device interface switching said connectors to select which of said connectors said plurality of slots are coupled to; and a diagnosis decoder that sequentially supplies each of said test modules with a diagnosis signal, which is received from one of said slots mounted with one of said test modules for diagnosis via one of said connectors; and
a configuration memory that stores a configuration file indicating first module identification information to identify one of said test modules to be mounted on one of said slots,
wherein said control unit detects which of said test modules said diagnosis signal received via each of said connectors is supplied to and which of said connectors each of said output ports is coupled to based on a result of detecting, each test module comprises:
a diagnosis circuit that outputs a predetermined signal to said control unit when receiving said diagnosis signal; and
an identification memory that stores second module identification information about said test module, said diagnosis circuit further outputs said second module identification information stored in said identification memory to said control unit, when receiving said diagnosis signal, and said control unit further judges whether or not one of said test modules is properly mounted on one of said slots by comparing a connector identification number corresponding to said second module identification information received from said one of said test modules mounted on said one of said slots with a connector identification number stored in the configuration file indicating said first module identification information about said one of said test modules to be mounted on said one of said slots stored in said identification memory.

6. The test apparatus as claimed in claim 3, wherein each of said test modules further comprises a device test circuit for generating said input signal based on said control signal, and each of said connectors comprises: a device pin for coupling said device test circuit and said electronic device; and a diagnosis pin for coupling said diagnosis circuit and said diagnosis decoder.

7. A configuration method for configuring a test apparatus for testing an electronic device, said test apparatus comprising:
   a bus switch unit comprising a plurality of output ports, said bus switch unit switching said output ports to select which of said output ports an input signal is output from;
   a control unit that inputs a plurality of control signals, according to a test program for testing said electronic device, to said bus switch unit and controls which of said output ports each of said control signals is output from;
   a plurality of slots provided corresponding to said plurality of output ports, wherein a test module, which generates an input signal to be input to said electronic device based on said control signal and receives an output signal output by said electronic device, is mounted on one of said plurality of slots; and
   a device interface comprising a plurality of connectors to be coupled to said electronic device, said device interface switching said connectors to select which of said connectors said one of said plurality of slots is coupled to, said configuration method comprising:
   sequentially supplying a diagnosis signal from one of said connectors to said test module to the output port of said bus switch unit to which said one of said plurality of slots corresponds;
   obtaining information representing from which of said connectors said test module receives said diagnosis signal; and
   detecting which of said connectors is coupled to each of said output ports by comparing a connector identification number corresponding to said information with a connector identification number stored in a configuration file indicating module identification information identifying said test module to be mounted on said one of said plurality of slots.

8. The configuration method as claimed in claim 7, wherein in said sequentially supplying, a first one of said test modules for diagnosis mounted on one of said slots sequentially generates said diagnosis signal to be supplied to a second one of said test modules.

9. A device interface for coupling an electronic device and a test apparatus body for testing said electronic device, said test apparatus body comprising:
   a bus switch unit comprising a plurality of output ports, said bus switch unit switching said output ports to select which of said output ports an input signal is output from;
   a control unit that inputs a plurality of control signals, according to a test program for testing said electronic device, to said bus switch unit and controls which of said output ports each of said control signals is output from; and
   a plurality of slots provided corresponding to said plurality of output ports, wherein a test module, which generates an input signal to be input to said electronic device based on said control signal and receives an output signal output by said electronic device is mounted on one of said plurality of slots, and
   said device interface comprising:
   a plurality of connectors to be coupled to said electronic device;
   a switch circuit that switches said connectors to select which of said connectors is coupled to said one of said plurality of slots; and
   a diagnosis decoder that sequentially supplies a diagnosis signal from one of said connectors to said test module to the output port of said bus switch unit to which said one of said plurality of slots corresponds,
   wherein said control unit obtains information representing from which of said connectors said test module receives said diagnosis signal supplied by said diagnosis decoder, and detects which of said connectors is coupled to each of said output ports by comparing a connector identification number corresponding to said information with a connector identification number stored in a configuration file indicating module identification information identifying said test module to be mounted on said one of said plurality of slots.

* * * * *